United States Patent [19]

Schade, Jr.

[11] E Re. 31,263

[45] Reissued May 31, 1983

[54] AMPLIFIER CIRCUITS

[75] Inventor: Otto H. Schade, Jr., North Caldwell, N.J.

[73] Assignee: RCA Corporation, New York, N.Y.

[21] Appl. No.: 153,630

[22] Filed: May 27, 1980

Related U.S. Patent Documents

Reissue of:

[64] Patent No.: 4,092,612
Issued: May 30, 1978
Appl. No.: 796,341
Filed: May 12, 1977

U.S. Applications:

[63] Continuation of Ser. No. 644,821, Dec. 29, 1975, abandoned.

[30] Foreign Application Priority Data

Feb. 24, 1975 [GB] United Kingdom ..... 07659/75

[51] Int. Cl.[3] ..... H03F 3/04

[52] U.S. Cl. ..... 330/288; 323/315; 330/264; 330/296; 330/300

[58] Field of Search ..... 330/264, 288, 296, 300; 323/315, 316

[56] References Cited

U.S. PATENT DOCUMENTS

| | | | |
|---|---|---|---|
| 3,668,541 | 6/1972 | Pease | 330/289 |
| 3,714,600 | 1/1973 | Kuijk et al. | 330/288 |
| 3,717,821 | 2/1973 | Amemiya et al. | 330/257 |
| 3,903,479 | 9/1975 | Limberg | 330/288 |
| 3,909,628 | 9/1975 | Muto | 307/229 |
| 3,925,718 | 12/1975 | Wittlinger | 330/288 X |

FOREIGN PATENT DOCUMENTS 1303690 1/1973 United Kingdom .

OTHER PUBLICATIONS

*Linear Integrated Circuits Handbook*, (File 625), pp. 511-516, RCA, 1975.

Burger et al., Fundamentals of Silicon Integrated Device Technology, vol. II, 1968, pp. 440-441.

Hart "Current Generators Using Unipolar-Bipolar Transistor Hybride", *Electronic Applications*, vol. 27, No. 1, 1966-1967, pp. 30-34.

H. C. Lin et al., "A Low Noise Integrated Unibi Amplifier With Novel Biasing Scheme and Structure", *1965 International Solid-State Circuits Conference*, pp. 114 & 115.

Radio und Fernsehen 16, (1967), No. 2, pp. 39-41.

Radio Fernsehen Elektronik, (1969), pp. 69-73.

*Primary Examiner*—James B. Mullins

*Attorney, Agent, or Firm*—Eugene M. Whitacre; Paul J. Rasmussen; Allen LeRoy Limberg

[57] ABSTRACT

A composite transistor device is described which comprises a field effect transistor having its transconductance multiplied by the current gain of a current mirror amplifier. The transconductances of such devices can be matched with an accuracy approaching that with which simple field effect transistors can be matched. The higher transconductances of the composite devices make possible a variety of new circuits with distinct performance advantages.

30 Claims, 12 Drawing Figures

AMPLIFIER CIRCUITS

Matter enclosed in heavy brackets [ ] appears in the original patent but forms no part of this reissue specification; matter printed in italics indicates the additions made by reissue.

This is a continuation of U.S. patent application Ser. No. 644,821 filed Dec. 29, 1975, now abandoned.

This application concerns a composite transistor device comprising a field effect transistor (FET) and a current mirror amplifier connection to multiply the transconductance of the FET, composite transistor devices of this type being useful in implementing a new class of integrated circuit configurations.

Increasing the effective transconductance of an FET by multiplying its channel current by the current gain of a bipolar transistor is a known technique. Price in U.S. Pat. No. 3,264,493 describes a Darlington cascade of an FET and of a bipolar transistor of the same conductivity type wherein the source and drain electrodes of the FET are connected to the base and collector electrodes, respectively, of the bipolar transistor. Valvo manufactures a composite device, its TAA 320, which uses a FET and a bipolar transistor of complementary conductivity types, the source and drain electrodes of the FET being connected to the collector and base electrodes, respectively, of the bipolar transistor.

Integrated circuit design places heavy reliance on the inherently close match between certain of the parameters of pairs of devices, since selection amongst a range of separately manufactured items is not available to the designer. Pairs of composite devices of either type described in the previous paragraph do not exhibit transconductances in closely predictable proportion to each other, which greatly impairs their usefulness in many integrated circuit designs. While the proportion between the transconductances of the FET's can be predicted with a good degree of certainty, the common emitter forward current gains ($h_{fe}$'s) of the bipolar transistors are apt to differ from each other and may do so by as much as ten percent or so.

When the transconductances of FET's are multiplied by the current gains of current mirror amplifiers of a type using bipolar transistors, thereby to amplify the channel currents of the FET's per the present invention, the proportion between the transconductances of the resulting composite transistor devices can be maintained with nearly as much accuracy as the proportion between the transconductances of the composite FET's themselves. Further, the use of these composite transistor devices to replace simple FET's in certain well-known configurations (such as long-tailed pairs, inverters, and current mirror amplifiers) leads to unexpected performance advantages. These composite transistor devices also permit a variety of novel structures.

In the drawing, in which each of the FIGURES illustrates an aspect of the present invention:

Figure 3:
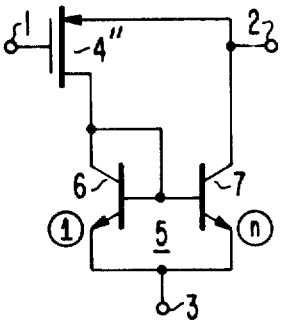
FIG. 3 is a full schematic diagram of another species of the amplifier shown in FIG. 1.
Figure 11:
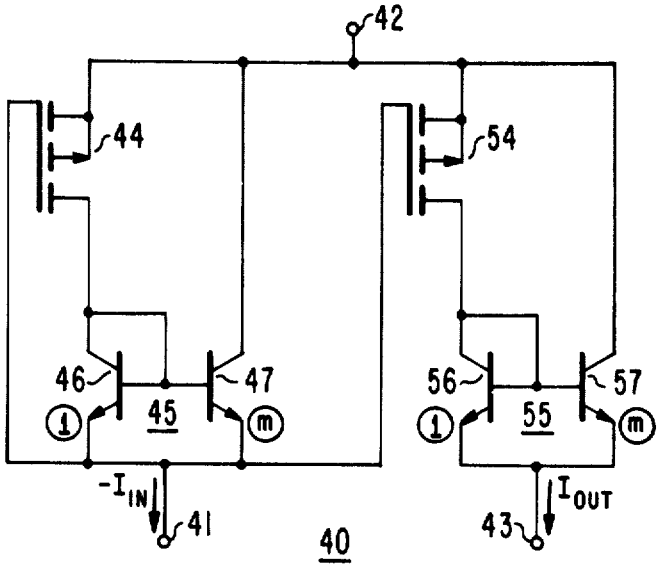
Figure 12:
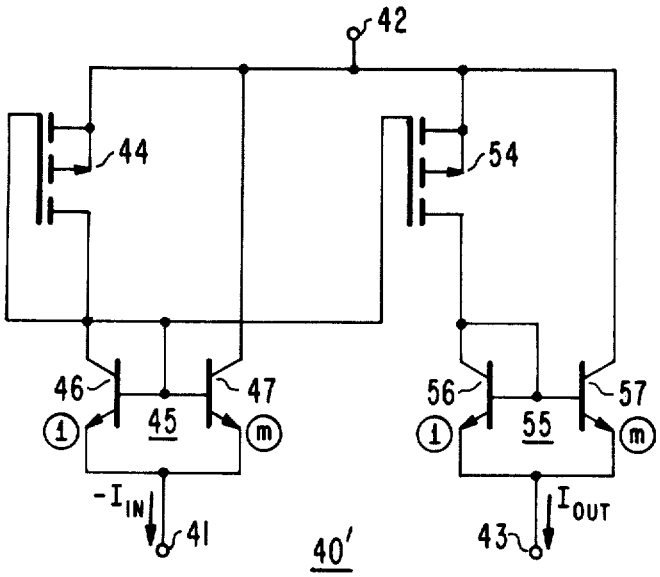

FIG. 11 is a schematic diagram of a current mirror amplifier connection, using a pair of amplifier circuits per FIG. 3 as composite transistor devices and exhibiting superior bandwidth characteristics to prior art current mirror amplifiers constructed with FET's; and FIG. 12 is a schematic diagram of a related current mirror amplifier connection using a pair of amplifier circuits per FIG. 3 as composite transistor devices and exhibiting superior bandwidth characteristics to prior art current mirror amplifiers constructed with FET's.

Figure 1:
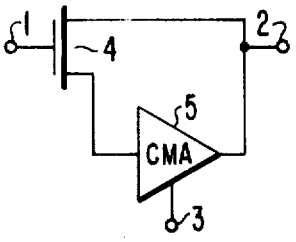
FIG. 1 is a schematic diagram, partially in block form of an amplifier operated as a composite transistor device comprising an FET and a current mirror amplifier connected per the present invention.

FIG. 1 shows an amplifier circuit having an input terminal 1 and a pair of output terminals 2 and 3. The input terminal 1 is connected to the gate electrode of a field-effect transistor 4, having its channel connected between the input and output connections of a current mirror amplifier 5. The output and common connections of current mirror amplifier 5 are connected to output terminals 2 and 3, respectively.

A current mirror amplifier, or "CMA" is an inverting current amplifier having its current gain, $-m$, determined by the ratio between the transconductances of certain of its component transistors. Since the transconductances of integrated circuit transistors can be accurately proportioned within the same integrated circuit, as the transistors are fabricated by the same process steps, the current gain of a CMA is well-defined and reliably predicted. Of great importance in this regard is the fact that while the $h_{fe}$'s of bipolar transistors are not precisely defined as between the various transistors on an integrated circuit, the proportions between their transconductances is amongst the best-defined of integrated circuit parameters.

The channel of FET 4 is connected in series with the input circuit of CMA 5 between output terminals 2 and 3, and the channel current in FET 4 flowing responsive to an input signal applied between terminal 1 and one of terminals 2 and 3 flows between terminals 2 and 3. Responsive to this current flow through the input circuit of the CMA another current m times as large is caused to flow through its output circuit between terminals 2 and 3. The total current flow between terminals 2 and 3 is therefor $(m+1)$ times as large as it would be were the transconductance of FET 4 not multiplied by the current gain of CMA 5. The FET 4 may either be enchancement or depletion type. The FET 4 may be an insulated-gate type, such as a metal-oxide-semiconductor type, or a junction type.

Figure 2:
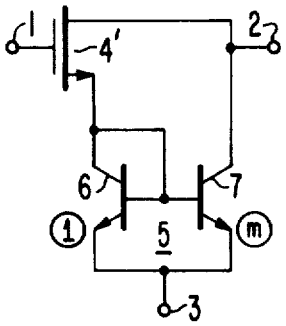
FIG. 2 is a full schematic diagram of a species of the amplifier shown in FIG. 1.

FIG. 2 shows a species of the amplifier circuit shown in FIG. 1. CMA 5 is the simple configuration described in U.S. Pat. Nos. 3,391,311 and 3,392,342. Basically, a current mirror amplifier comprises a pair of transistors such as 6 and 7. The first of these transistors—e.g., 6—has its collector-to-emitter path galvanically coupled between the output and common connections of the CMA. The first transistor as provided with direct coupled collector-to-base feedback to adjust its base-emitter potential to condition the first transistor for a collector-to-emitter current flow substantially equal to the current applied between the input and common connections of the transistor; in CMA 5, this feedback is provided by the direct connection of the collector electrode of transistor 6 to its base electrode. Means are provided for applying the same base-emitter potential as applied to the first transistor to the second transistor, conditioning the second transistor for a collector current related to the collector current of the first transistor in the same ratio as the transconductance of the second transistor is related to the transconductance of the first. The ratio between the transconductances of integrated circuit transistors constructed of the same basic semiconductor material, constructed to have the same junction profiles by virtue of being fabricated by the same processing steps and operated at the same temperature T, is essentially equal to the ratio of the areas of their respective base-emitter junctions. In the figures, the area of the base-emitter junction of a particular transistor relative to an arbitrary norm is indicated by a small encircled number near its emitter connection. Transistors 6 and 7 have base-emitter junction areas in 1:m ratio, respectively, making the current gain of CMA 5 equalto $-m$.

In the FIG. 2 amplifier, which is a species of the FIG. 1 amplifier, FET 4' is an N-channel device, making it of similar conductivity type to that of NPN transistors 6 and 7 of CMA 5. Indeed, CMA 5 may be looked upon as being a composite NPN transistor device and so have NPN conductivity type ascribed to it. With FET 4' being of similar conductivity type of CMA 5, its source electrode and drain electrodes are connected to the input connection and to the output connection, respectively, of CMA 5. Terminal 3 is the common terminal shared by the input and output circuits of the FIG. 2 amplifier circuit.

The direct coupled collector-to-base feedback of the first transistor causes the input impedance of CMA 5 to be quite low compared to the source impedance of FET 4'. The input impedance afforded by the self-biased transistor 6 is inversely proportional to its transconductance, or $g_m$, which has a value of about 38 millimhos per milliampere of emitter current. The self-biased transistor maintains a potential of about 0.6 volts across itself over a wide range of emitter current, assuming it to be formed in silicon.

When an input potential is applied between terminals 3 and 1 of the FIG. 2 amplifier, a potential $V_{GS}$ about 0.6 volts smaller appears between the source and gate electrodes of FET 4'. The drain-to-source current flowing in FET 4' flows through the input circuit of CMA 5 to cause a collector-to-emitter current essentially m times as large in transistor 7. So starting with the conventional drain current $I_p$ versus source-to-drain potential $V_{DS}$ as a function of various values of source-to-gate [potetial] *potential* $V_{GS}$ characteristic curve of the FET 4', one can obtain the characteristic curve for the composite device provided by the FIG. 2 amplifier circuit, using the following steps. The $V_{GS}$ values are augmented by 0.6 volts, and the $V_{DS}$ scale is shifted 0.6 volts positive. Both of these steps are taken to allow for the drop across the input circuit of current mirror amplifier 5. The $I_D$ current scale is multiplied by a factor of $(m+1)$.

FIG. 3 shows another species of the amplifier circuit of FIG. 1, wherein FET 4'' is of complementary conductivity type to that of current mirror amplifier 5. In this amplifier, the drain and source electrodes of FET 4 are connected to the input connection and to the output connection, respectively, of CMA 5. Terminal 2 is the common terminal shared by the input and output circuits of the FIG. 3 amplifier circuit.

In this circuit, the input potential between terminals 1 and 2 is applied directly between the source and gate electrodes of FET 4''. The resultant drain current of FET 4'' flows through the input circuit of the CMA 5 to cause a collector-to-emitter current through transistor 7 n times as large as that drain current. So starting with the conventional $I_D$ versus $V_{DS}$ as a function of various values of $V_{GS}$ characteristic curve of FET 4'', the characteristic curve for the composite device provided by the FIG. 3 amplifier circuit can be obtained by the following steps. The $V_{DS}$ scale is shifted 0.6 volts positive to allow for the drop across the input circuit of current mirror amplifier 5. The $I_D$ scale is multiplied by a factor of $(n+1)$.

Now, a great number of different types of CMA's are known which may replace the simple CMA comprising self-biased transistor 6 in parallel connection with the base-emitter junction of transistor 7, to implement the present invention in various ways. These replacement CMA's may use FET's instead of bipolar transistors as the devices which have proportioned transconductances to determine the current gain of the CMA. The simple CMA using bipolar transistors is advantageous, however, for use in circuits where the $V_{DS}$ available to the FET is restricted.

FIGS. [4–14] *4–12* show embodiments of the present invention wherein the FET's are shown as being enhancement, insulated-gate types. For example, such FET's may be metal-oxide-semiconductor FET's—i.e., MOS-FET's—which are capable of being fabricated on the same substrate as bipolar transistors.

Figure 4:
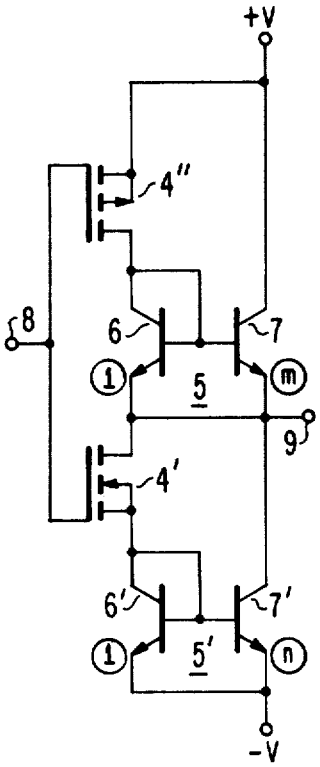
FIGS. 4 and 5 are schematic diagrams of an inverting amplifier stage constructed of first and second amplifier circuits of the sorts shown in FIGS. 2 and 3, respectively.

FIG. 4 shows an inverter amplifier comprising an amplifier circuit per FIG. 2 and an amplifier circuit per FIG. 3 as composite devices to replace the N-channel and p-channel FET's, respectively, of a conventional complementary metal-oxide-semiconductor (CMOS) inverter amplifier. The two types of amplifier circuits are used to achieve complementary conduction, so that the inverter amplifier may be integrated using all vertical-structure bipolar transistors of one conductivity type and avoiding lateral-structure bipolar transistors of the opposite conductivity type, which have inferior operating characteristics compared to the vertical-structure transistors. Terminals 8 and 9 are the input and output terminals, respectively, of the inverter amplifier. The inclusion of the CMA's 5 and 5' add very little additional stray capacitance to the structure, particularly when the transistors 7 and 7' are an integral structure with FET's 4' and 4''. The transconductances ($g_m$'s) of the composite devices can be made substantially greater than those of simple FET's; however, although stray capacitances (C's) remain about the same. [Thie] *This* provides improved $g_m/C$ ratio and so increases the gain-bandwidth product of the inverter amplifier. Compared to simple FET's of the same transconductance, the composite devices take up much less area on the integrated-circuit die.

The saturation resistance of the composite devices are substantially lower than those of the simple FET's and they exhibit lower output impedance during switching for a given current consumption. In the "on" condition, if drain current levels are substantially large—say, greater than 100 microamperes—, the saturation voltage of the composite device is lower than that of the simple FET. The offset potential across self-biased transistor 6' is saturated from input noise immunity, but this is often a minor shortcoming. One can make the current gains —(m+1) and —(n+1) of CMA's 5 and 5', respectively, different to adjust the complementary transfer characteristics of the composite devices, if desired, or to set them equal.

An important thing to understand is that in an inverter amplifier it is often desirable that the ratio of transconductances of the paired complementary-conductivity devices can be closely predicted, so the immunity to noise of each polarity is predictable and can be relied on. Multiplying the transconductances of complementary-conductivity FET's 4' and 4'', by predictable and controlled current gains in CMA's fulfills this desire.

Figure 5:
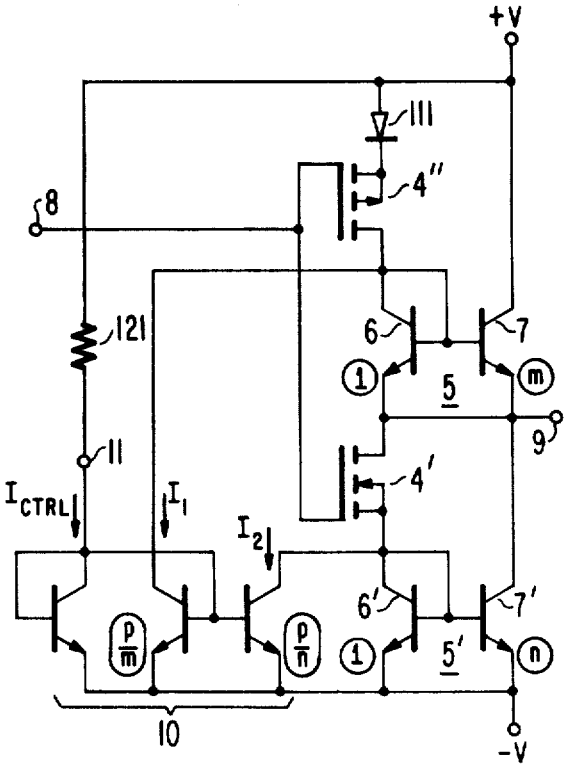

FIG. 5 shows a more complex inverter amplifier than the FIG. 4 inverter amplifier, but sharing many of its features. A dual output CMA 10 will respond to a control current $I_{CTRL}$ applied to its input terminal 11 to demand output currents $I_1$ and $I_2$. $I_1$ and $I_2$ divert portions of the currents otherwise applied in full to the input circuits of CMA's 5 and 5', respectively, away from those input circuits. This permits an adjustable reduction in the current flow through the collector-to-emitter paths of transistors 7 and 7' when the inverter amplifier output signal at terminal 9 is at a quiescent value—e.g., midway between the supply potentials +V and −V. The control current $-I_C$ can be made to change substantially linearly with the difference between +V and −V, which can be expediently done by developing $I_C$ using the behavior in accordance with Ohm's Law if a resistive element 12 is connected between the +V potential and terminal 11.

Diode 111 is inserted in the FIG. 5 inverter amplifier to improve the symmetry of output signal swing. Many applications do not require such improved symmetry, permitting the omission of diode 111 as in FIG. 4.

Figure 6:
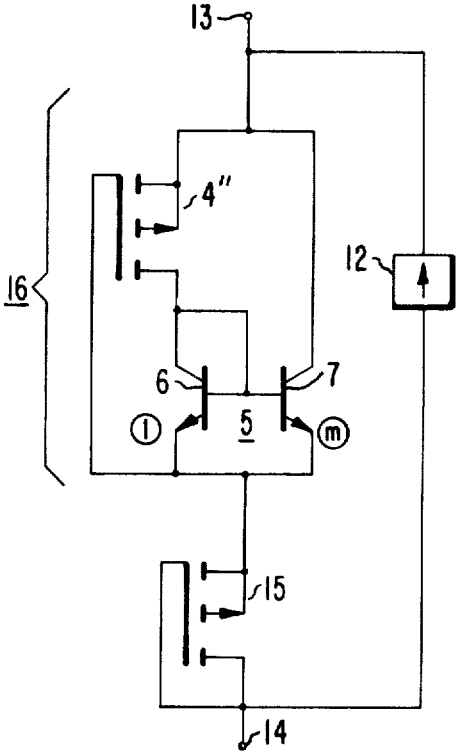
FIG. 6 is a schematic diagram of a bias potential supply which includes the circuit of FIG. 3.

FIG. 6 shows a bias potential supply for responding to current from constant-current source 12 to develop an offset potential between its terminals 13 and 14 which is substantially one-and-a-half times as large as the offset potential across self-biased FET 15. Self-biased FET 15 and a self-biased composite transistor 16, similar to the amplifier circuit of FIG. 3, are in series connection between terminals 13 and 14, to receive current from source 12. The drop across the self-biased composite transistor 16 is equal to the source-to-gate voltage $V_{GS4''}$ of transistor 4''. If CMA 5 has a current gain m which is a few times unity, most of the current from source 12 will pass through the collector-to-emitter path of transistor 7, rather than through the source-to-gate path of FET 4'' and self-biased transistor 6. Accordingly, the value of $V_{GS4''}$ required to maintain its relatively small share of the current from source 12 will be only a fraction of the source-to-gate potential $V_{GS15}$ required by self-biased FET 15 to condition itself for conducting the entire current from source 12. The self-biased composite transistor 16 may be serially connected with any number, n, of self-biased FET's to receive a bias current and to respond to that bias current to provide a voltage n plus the fraction, quantity, times as large as the source-to-gate potential, $V_{GS}$, of a single, self-biased FET. The value of m required to develop the desired fraction of $V_{GS}$ will depend upon the particular drain current versus $V_{GS}$ characteristics of the FET's. Care must be taken to select a value for the fraction of $V_{GS}$ large enough to exceed the threshold value of $V_{GS}$ where the FET becomes conductive and large enough so that $V_{DS}$, smaller than $V_{GS}$ by the input offset of the CMA, is maintained large enough to avoid potential saturation in the FET. In the COSMOS-bipolar integrated-circuit process of RCA Corporation using metal-oxide-semiconductor FET's with threshold potentials of 1.7 to 2 volts, a design wherein $V_{GS}/2=2$ volts uses an m of 4.

Figure 7:
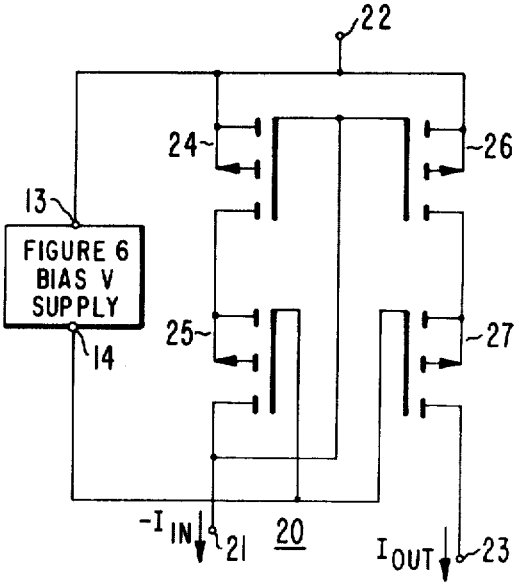
FIG. 7 is a schematic diagram of a current mirror amplifier with cascoded FET's in its input and output circuits, using the bias potential supply of FIG. 6.

FIG. 7 shows a CMA 20 having an input terminal 21, a common terminal 22, and an output terminal 23. FET 24 is in cascode configuration with FET 25, the drain current of FET 24 being coupled by means of the common-gate amplifier action of FET 25 to input terminal 21. The gate electrode of 24 is also connected to terminal 21, so FET 24 is self-biased, adjusting its drain current to equal the current demanded from terminal 21. FET's 24 and 26 are connected source-to-source and gate-to-gate with each other so their $V_{GS}$'s are equal and their drain currents are related in the same proportion as their transconductances are. FET 26 is in cascode configuration with FET 27, and the drain current of FET 26 is coupled by means of the common-gate amplifier action of FET 27 without gain or attenuation to output terminal 23.

The gate electrodes of FET's 25 and [37] *27* are each offset from common terminal 22 by a potential substantially 1.5 times the $V_{GS}$'s of FET's 24, 25, 26, 27 for nominal design current levels. This potential offset is provided by a bias potential supply per FIG. 6, having its terminal 13 connected to common terminal 22 and having its terminal 14 connected to the joined gate electrodes of FET's 25 and 27. No appreciable current can flow through the gate electrodes of FET's 25 and 27 so there is no diversionary path for the constant current from source 5 to interfere with operation of the bias potential supply per FIG. 6. The [sourcefollower] *source-follower* action of FET's 25 and 27 establishes their quiescent source potentials about 0.5 $V_{GS}$ less positive or more negative than the potential at terminal 22, so FET's 24 and 26 are operated with quiescent $V_{DS}$'s about 0.5 times their quiescent $V_{GS}$'s.

An [attractice] *attractive* feature of current amplifier 20 is that its input potential between terminals 21 and 22 is only $IV_{GS}$ despite the cascode arrangement of FET's 24 and 25. Further, its output potential between terminals 23 and 22 can approach one-half $V_{GS}$ without affecting the current gain of amplifier 20 appreciably, despite the cascode arrangement of FET's 26 and 27. So, FET 25 is operated with a $V_{DS}$ approximately one-half its $V_{GS}$.

The cascode arrangement of FET's 26 and 27 largely isolates the drain electrode of FET 26 from the output potential variations at terminal 23, substantially reducing differences in $V_{DS}$ as between FET's 24 and 26 that would affect the proportion between their relative transconductances. This results in higher output impedance as viewed looking back into terminal 23. Also, the ratio between the transconductances of FET's 24 and 26 and hence the current gain of amplifier 20 are determined substantially solely by the geometry of FET's 24 and 26 and more independently of output potential variations between terminals 22 and 23.

Figure 8:
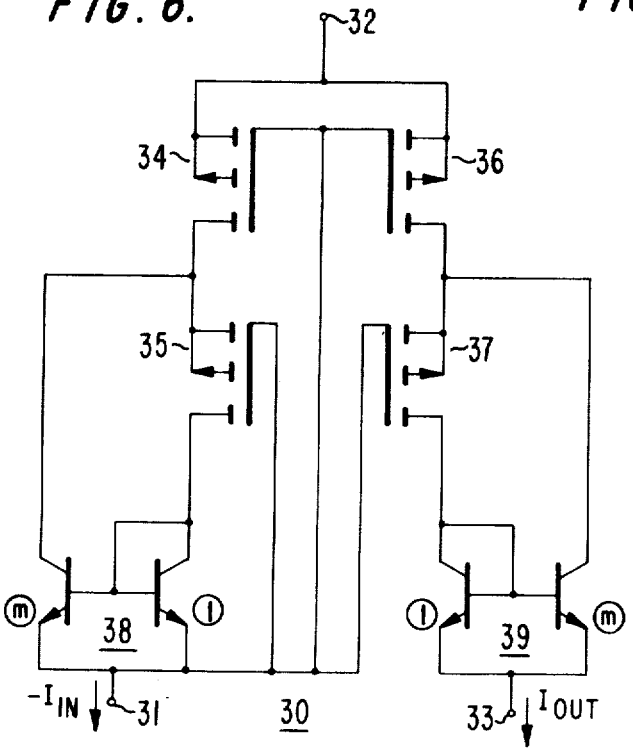
FIGS. 8, 9 and 10 are schematic diagrams of current mirror amplifiers with a cascoded FET and a composite transistor device per FIG. 3 in their input and output circuits.

FIG. 8 shows a CMA 30 having an input terminal 31, a common terminal 32, and an output terminal 33. CMA 30 exhibits a current gain equal to the transconductance of transistor 36 divided by the transconductance of transistor 34. FET [14] *34* has drain-to-gate feedback (coupled through elements 35, 38) to regulate its source-to-gate potential $V_{GS34}$ to a value to condition it to provide a drain current equal to the current $-I_{IN}$ demanded at terminal 31. $V_{GS34}$ is applied between the source and gate electrodes of FET 36 to cause it to provide a drain current proportional to that supplied by FET 34, in proportion to the relative transconductances of FET's 36 and 34. The drain current of FET 36 is coupled through elements 37, 39 without gain or attenuation to output terminal 33.

The similarity of the interconnections of FET 35 and current amplifier 38 to those of FET 4'' and CMA 5 in the self-biased composite transistor circuit 16 of FIG. 6 should be readily apparent. Much as the circuit 16 maintains a potential between its terminals 2 and 4 substantially one-half the $V_{GS}$ of self-biased FET 15 responsive to the same current flow through them as provided from source 12, in the FIG. 8 current amplifier 30 the interconnections of FET 35 and current amplifier 38 maintain, in response to the drain current of FET 34, a potential between the drain electrode of FET 34 and input terminal 31 substantially one-half $V_{GS34}$. This means FET 34 operates with a source-to-drain potential $V_{DS34}$ substantially one-half $V_{GS34}$, which will not interfere substantially with its transistor action and which is done so $V_{DS34}$ will be similar to the source-to-drain potential $V_{DS36}$ of FET 36.

Now, FET 36 is operated with a fixed source-to-drain potential $V_{DS36}$ rather than having its drain electrode connected directly to output terminal 33. This is done so that its transconductance (and consequently the current gain of current amplifier 30) will be less affected by swings in potential at output terminal 33. To this end, FET 37 has its gate electrode biased to the same potential as the gate electrode of FET 35, and current amplifier 39 is used to shunt a similar portion of $I_{OUT}$ through the output circuit of current amplifier 39, rather than through its input circuit and the channel of FET 37, much as current amplifier 38 shunts the selfsame-fraction of $-I_{IN}$ through its output circuit, rather than through its input circuit and the channel of FET 35. Accordingly, if FET 37 has its channel and gate geometries proportioned to those of FET 36 in the same ratios as FET 35 has its proportioned to those of FET 34, the $V_{GS}$'s of FET's 35 and 37 will both be about 0.5 $V_{GS34}$. So, $V_{DS36}$ and $V_{DS34}$ will both be substantially equal to each other and to 0.5 $V_{GS34}$.

Figure 9:
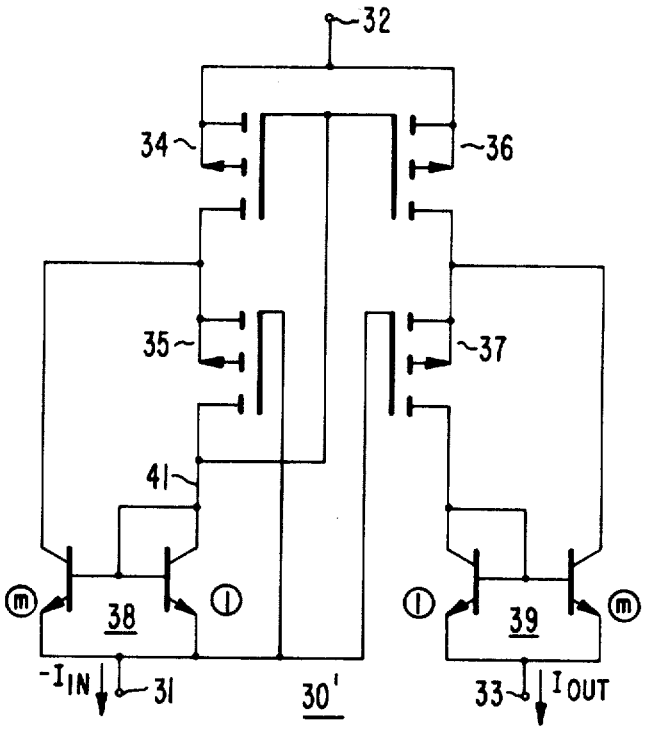
Figure 10:
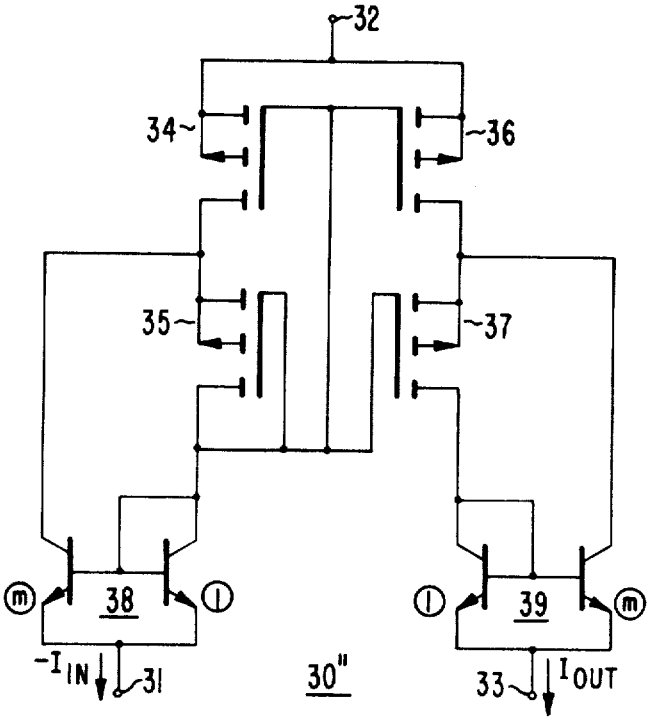

FIGS. 9 and 10 show variants 30' and 30'' of current amplifier 30. In FIG. 9, the gate electrodes of FET's 34 and 36 are biased to the potential at the input node rather than common node of current amplifier 36. This increases the input potential response to $-I_{IN}$ that appears between terminals 31 and 32 to $V_{GS34}$ plus the base-emitter offset potential of the input transistor of current amplifier 38. This permits the $V_{GS}$ of FET 35 to be slightly larger, without unduly reducing $V_{DS34}$, so $(m+1)$ can be made smaller to conserve area on an integrated circuit die. Since the $V_{DS}$ requirements of FET 35 are smaller than those of FET's 34 and 36, owing to lower channel current in FET 35, it may be desirable to include additional potential offsetting elements in connection 41. This will increase the input potential and minimum output potential requirements of current amplifier 30 somewhat, but will permit higher levels of channel current in FET's 34 and 36 before they go into voltage-limited saturation. Also, of course, current amplifiers 38 and 39 might be replaced by ones with larger input offset potentials.

The FET's in the circuits of FIGS. 8, 9 and 10 may be operated with $V_{GS}$'s that differ from one-half their $V_{DS}$'s, the assumed values of $V_{GS}$ being chosen to suggest the feasibility of operation with $V_{DS}$'s lower than $V_{GS}$. The ranges of operation of these circuits depend upon the threshold potentials and source-to-drain saturation potentials of the FET's and the base-emitter offset potentials of the bipolar transistors used to multiply the transconductances of the FET's, as will be appreciated by those skilled in the art.

FIG. 11 shows a current amplifier 40 which has exceptionally good bandwidth as compared to conventional current mirror amplifiers employing lateral-structure junction transistors of FET's. FET's 44 and 54 both have their gate electrodes connected to the input terminal 41 of current amplifier 40 and both have their source electrodes connected to the common terminal 42 of current amplifier 40. FET's 44 and 54 therefore have substantially equal $V_{GS}$'s, $V_{GS44}$ and $V_{GS54}$, respectively; and their drain currents are related in the same ratio as their relative transconductances. The transconductance of FET's 44 and 54 are proportionally related to their channel width-to-length ratios, with the relationship being better maintained the more nearly alike the $V_{DS}$'s of FET's 44 and 54 are.

The direct coupling between the input terminal 41 and gate electrode of FET 44 adjusts $V_{GS44}$ to be of such value that the drain current of FET 44 is essentially equal to $-I_{IN}/(m+1)$. This current applied to the input node of current mirror amplifier 45 causes the current mirror amplifier 45 to supply a current equal to $-I_{IN}$ from its common node connected to input terminal 41. More particularly, the collector-to-base feedback connection of junction transistor 46 in current mirror amplifier 45 adjusts the base-emitter potential of transistor 46 to condition it to accept the $-I_{IN}/(m+1)$ drain current of FET 44 as collector current (except, of course, for the usually negligible portions required as base currents by transistors 46 and 47). The base-emitter potential of transistor 46 as applied to the base-emitter junction of transistor 47, having an effective area m times as large as that of the base-emitter junction of transistor 46, causes transistor 47 to have a collector current essentially $(m+1)$ times as large as that of transistor 46. That is, a current essentially equal to $-m\,I_{IN}/(m+1)$ flows from common terminal 42 to input terminal 41 via the collector-to-emitter path of transistor 47. Thus, the drain-to-gate feedback of FET 44 adjusts the combined emitter current flows of junction transistors 46 and 47 to equal the $-I_{IN}$ demand imposed on input terminal 41.

The drain current flowing from FET 54 is direct coupled to the output terminal 43 of the current amplifier. In current amplifier 40, this direct coupling is afforded by a current mirror amplifier 55 connected to multiply the drain current of FET 54 by a factor of $(m+1)$. The collector-to-base feedback connection of transistor 56 adjusts its base-emitter potential to condition transistor 56 to accept the drain current of FET 54, which drain current is equal to $-kI_{IN}/(m+1)$, where $k=g_{m44}/g_{54}$, $g_{m44}$ and $g_m$54 being the transconductances respectively of FET 44 and of FET 54. The same base-emitter potential is applied to the base-emitter junction of transistor 57 which junction has an effective area m times as large as that of transistor 56. Because of this relationship between the effective areas of the base-emitter junctions of transistors 57 and 56, transistor 57 has an emitter current m times the emitter current of transistor 56. That is, the emitter current of transistor 57 is equal to $-kmI_{IN}/(m+1)$, supported by collector current flow to transistor 57 from common terminal 42. The sum of the emitter currents of transistors 56 and 57, $-kI_{IN}$, flows to the output terminal 43.

The bandwidth improvement obtainable with the FIG. 11 configuration as compared with a standard FET current mirror amplifier comes about because the current mirror amplifier 45 can multiply the transconductance of FET 44 by a greater factor than the factor by which its presence increases the capacitance at input terminal 41. It is interesting to note the tendency for similarity of base current errors in current mirror amplifiers 45 and 55 arising from the $h_{fe}$'s of transistors 46, 47, 56 and 57 being finite, so that in the configuration of current amplifier 40 these errors tend to have no affect on the overall current gain of current amplifier 40. Current amplifier 40 is also characterized by a lower input offset voltage than found in prior art FET current mirror amplifiers on account of the $V_{GS}$ of FET 44 being kept small in accordance with the present invention.

FIG. 12 shows a current amplifier 40', differing from current amplifier 40, in that the gate electrodes of transistors 44 and 54 are offset from the potential appearing at input terminal 41 by the offset potential across self-biased transistor 46. A number of other alternatives to current amplifier 40 will occur to the skilled circuit designer in light of the foregoing description, some of which alternatives are described following. The scaling of $I_{OUT}$ to the $-I_{IN}/(m+2)$ drain current of FET 44 can be carried out solely by proportioning of the channel width-to-length ratio of FET's 44 and 54, with current mirror amplifier 55 omitted and the drain electrode of FET 54 directly connected to terminal 43. A number of other types of current amplifiers with well-defined current gain may replace the simple current mirror amplifier 45 or 55. Source degeneration resistances may be provided for FET's 44 and 54.

What is claimed is:

1. A field effect transistor having source and drain electrodes with a channel therebetween, having a gate electrode, and having in combination therewith:

means for multiplying the transconductance of said field effect transistor by a constant predictable factor greater than unity, which means comprises:

a current amplifier having an input circuit and an output circuit and exhibiting a current gain G between its input and output circuits determined by the ratio of the transconductances of a pair of its component bipolar transistors;

a series connection of the channel of said field effect transistor and the input circuit of said current amplifier, whereby the channel current of said field effect transistor flows through the input circuit of said current amplifier, and means connecting said series connection in parallel with the output circuit of said current amplifier, for summing the current flows through them to obtain an output current greater than the channel current flowing through said field effect transistor by a predictable factor equal to $(1+G)$.

2. An amplifier circuit comprising:

a current mirror amplifier having an input terminal, an output terminal, a common terminal, first and second bipolar transistors of the same conductivity type, having respective emitter electrodes each connected to said common terminal, having respective collector electrodes respectively connected to said input terminal and to said output terminal, and having respective base electrodes connected to operate at the same potential, and a feedback connection between the collector and base electrodes of said first transistor, said current mirror amplifier exhibiting constant current gains between both its input and output terminals and its input and common terminals;

a field effect transistor having a conduction channel connected between the input and output terminals of said current mirror amplifier and having a gate electrode;

an input circuit for said amplifier circuit comprising the circuit between the gate electrode of said field effect transistor and one of the common and output terminals of said current mirror amplifier; and an output circuit for said amplifier circuit comprising the circuit between the common and output terminals of said current mirror amplifier.

3. An amplifier circuit as set forth in claim 2 wherein said field effect transistor is of the same conductivity type as said first and second bipolar transistors, said field effect transistor has source and drain electrodes connected respectively to the input terminal and to the output terminal of said current mirror amplifier between which electrodes its conductive channel resides, and the input circuit for said amplifier circuit comprises the circuit between the gate electrode of said field effect transistor and the common terminal of said current mirror amplifier.

4. An amplifier circuit as set forth in claim 2 wherein said field effect transistor is of the opposite conductivity type as first and said second bipolar transistors, said field effect transistor has source and drain electrodes connected respectively to the output terminal and to the input terminal of said current mirror amplifier between which electrodes its conductive channel resides, and the input circuit for said amplifier circuit comprises the circuit between the gate electrode of said field effect transistor and the output terminal of said current mirror amplifier.

5. An amplifier circuit as set forth in claim 2 having in combination therewith:

a source of bias current connected between the output and common terminals of said current mirror amplifier; and a direct-coupled feedback connection between said one of said common and output terminals of said current mirror amplifier and the gate electrode of said field effect transistor, whereby a potential is provided between the output and common terminals of said current mirror amplifier responsive to said bias current.

6. An inverting amplifier comprising:

first and second terminals between which an operating potential may be applied;

a third terminal for receiving input signal;

a fourth terminal for delivering output signal;

first and second current mirror amplifiers, each of a type including a respective pair of bipolar mirroring transistors of a first conductivity type and having respective input and common and output terminals, the output terminal of said first current mirror amplifier being connected to said first terminal, the common terminal of said first current mirror amplifier and the output terminal of said second current mirror amplifier being connected to said fourth terminal, and the common terminal of said second current mirror amplifier being connected to said second terminal;

first and second field effect transistors being respectively of said first conductivity type and of a second conductivity type complementary to said first conductivity type, said first and said second field-effect transistors each having a respective gate electrode connected to said third terminal, said first field effect transistor having source and drain electrodes respectively connected to the output terminal and to the input terminal of said first current mirror amplifier, said second field effect transistor having drain and source electrodes connected respectively to the output terminal and to the input terminal of said second current mirror amplifier.

7. An inverting amplifier configuration as set forth in claim 6 additionally comprising:

means for supplying first and second current substantially proportionally related to said operating potential;

means for applying said first current to the input terminal of said first current mirror amplifier; and means for applying said second current to the input terminal of said second current mirror amplifier.

8. A bias potential supply for providing bias potential suitable for biasing a cascode connection of field effect transistors, said supply comprising:

first and second terminals;

means for applying a bias current between said first and said second terminals;

first and second field effect transistors each having drain and source electrodes with a channel therebetween and each having a gate electrode;

a current mirror amplifier of a type including a pair of bipolar mirroring transistors of opposite conductivity type to said first field effect transistor, said current mirror amplifier having input and output and common terminal respectively connected to the drain and source and gate electrodes of said first field effect transistor, thereby to form a first two-terminal network with its terminals respectively at the source electrode of said first field effect transistor and at the common terminal of said current mirror amplifier;

a second two-terminal network consisting of said second field effect transistor with gate electrode connected to its drain electrode, the terminals of said second two-terminal network being respectively at the source and at the drain electrodes of said second field effect transistor; and means serially connecting said first and said second two-terminal networks between said first and said second terminals for conducting said bias current, thereby to develop a bias potential between said first and said second terminals.

9. A bias potential supply as set forth in claim 8 in combination with the following elements to provide an amplifier circuit:

third, fourth and fifth terminals for serving respectively as the input, output and common terminals of said amplifier circuit;

third and fourth field effect transistors of the same conductivity type, each having source and drain and gate electrodes, the source and drain electrodes of said third field effect transistor being respectively connected to said fifth terminal and to the source electrode of said fourth field effect transistor, the gate electrode of said third field effect transistor having said third terminal direct coupled thereto, and the drain electrode of said fourth field effect transistor being connected to said fourth terminal;

means for applying the bias potential provided by said bias supply between said fifth terminal and the gate electrode of said fourth field effect transistor in a poling to complete a cascode connection of said third and said fourth field effect transistors.

10. A bias potential supply as set forth in claim 8 in combination with the following elements to provide an amplifier circuit:

third, fourth and fifth terminals for serving respectively as the input, output and common terminals of said amplifier circuit;

third, fourth, fifth and sixth field effect transistors of the same conductivity type, each having source and drain and gate electrodes, the source electrodes of said third and said fourth field effect transistors being connected to said fifth terminal, the drain electrodes of said third and said fourth field effect transistors being respectively connected to the source electrode of said fifth field effect transistor and to the source electrode of said sixth field effect transistor, the drain electrodes of said fifth and said sixth field effect transistors respectively connected to said third terminal and to said fourth terminal, the gate electrodes of said third and said fourth field effect transistors having said third terminal direct coupled thereto; and means for applying the bias potential provided by said bias supply between said fifth terminal and an interconnection between the gate electrodes of said third and said fifth field effect transistors in a poling to implement the cascode operation of said third and said fifth field effect transistors and to implement the cascode operation of said fourth and said sixth field effect transistors.

11. An amplifier circuit comprising:

first, second and third terminals for serving respectively as input, output and common terminals of said amplifier circuit;

first, second, third and fourth field effect transistors of a first conductivity type, each of said field effect transistors having source and drain and gate electrodes, said first terminal being connected to the gate electrodes of each of said field effect transistors, the source electrodes of said first and said second field effect transistors being connected to said third terminal, the drain electrodes of said first and said second field effect transistors being respectively connected to the source electrode of said third field effect transistor and to the source electrode of said fourth field effect transistor; and first and second current mirror amplifiers, each of a type including a respective pair of bipolar mirroring transistors of a second conductivity type complementary to said first conductivity type and having respective input and output and common terminals, the input and output terminals of said first current mirror amplifier being connected to the drain and source electrodes respectively of said third field effect transistor, the input and output terminals of said second current mirror amplifier being connected to the drain and source electrodes respectively of said fourth field effect transistor, and the common terminals of said first and said second current mirror amplifiers being respectively connected to said first terminal and to said second terminal.

12. An amplifier circuit comprising:

first, second and third terminals for serving respectively as input, output and common terminals of said amplifier circuit;

first, second, third and fourth field effect transistors of a first conductivity type, each of said field effect transistors having source and drain and gate electrodes, said first terminal being connected to the gate electrodes of said third and said fourth field effect transistors, the source electrodes of said first and said second field effect transistors being connected to said third terminal, the drain electrodes of said first and said second field effect transistors being respectively connected to the source electrode of said third field effect transistor and to the source electrode of said fourth field effect transistor; and first and second current mirror amplifiers, each of a type including a respective pair of bipolar mirroring transistors of a second conductivity type complementary to said first conductivity type and having respective input and output and common terminals, the input and output terminals of said first current mirror amplifier being connected to the drain and source electrodes respectively of said third field effect transistor, the input and output terminals of said second current mirror amplifier being connected to the drain and source electrodes respectively of said fourth field effect transistor, the common terminals of said first and said second current mirror amplifiers being respectively connected to said first terminal and to said second terminal, and the input terminal of said first current mirror amplifier being direct coupled to an interconnection between the gate electrodes of said first and said second field effect transistors.

13. An amplifier circuit comprising:

first, second and third terminals for serving respectively as input, output and common terminals of said amplifier circuit;

first, second, third and fourth field effect transistors of a first conductivity type, each of said field effect transistors having source and drain and gate electrodes, the source electrodes of said first and said second field effect transistors being connected to said third terminal, the drain electrodes of said first and said second field effect transistors being respectively connected to the source electrode of said third field effect transistor and to the source electrode of said fourth field effect transistor; and first and second current mirror amplifiers, each of a type including a respective pair of bipolar mirroring transistors of a second conductivity type complementary to said first conductivity type and having respective input and output and common terminals, the input and output terminals of said first current mirror amplifier being connected to the drain and source electrodes respectively of said third field effect transistor, the input and output terminals of said second current mirror amplifier being connected to the drain and source electrodes respectively of said fourth field effect transistor, the common terminals of said first and said second current mirror amplifiers being respectively connected to said first terminal and to said second terminal, and the input terminal of said first current mirror amplifier being direct coupled to an interconnection between the gate electrodes of said first and said second field effect transistors and being direct coupled to an interconnection between the gate electrodes of said third and said fourth field effect transistors.

14. An amplifier circuit comprising:

first, second and third terminals for serving as the input, output and common terminals respectively of said amplifier circuit, first and second field effect transistors of a first conductivity type, each having source and drain and gate electrodes, their respective source electrodes being connected to said third terminal;

first and second current mirror amplifiers, each of a type including a respective pair of bipolar mirroring transistors of a second conductivity type complementary to said first conductivity type, said first current mirror amplifier having input and output terminals connected to the drain and source electrodes respectively of said first field effect transistor, said second current mirror amplifier having input and output terminals connected to the drain and source electrodes respectively of said second field effect transistor, said first and said second current mirror amplifiers having respective common terminals respectively connected to said first terminal and to said second terminal; and means for direct coupling said first terminal to an interconnection between the gate electrodes of said first and second field effect transistors.

15. An amplifier circuit as set forth in claim 14 wherein said means for direct coupling said first terminal to an interconnection consists of a connection between said input terminal and said interconnection.

16. An amplifier as set forth in claim 14 wherein said means for direct coupling said first terminal to an interconnection comprises a connection of the input terminal of said first current mirror amplifier to said interconnection.

17. An amplifier circuit comprising:

a current mirror amplifier having input and output and common terminals, said current mirror amplifier having an output circuit between its output and common terminals for connection to subsequent circuitry and exhibiting constant current gains between both its input and output terminals and its input and common terminals, and a field-effect transistor of similar conductivity type to said current mirror amplifier, having a gate electrode for connection to preceding circuitry and having a channel with source and drain electrodes at opposite ends thereof respectively connected to the input and output terminals of said current mirror amplifier.

18. An amplifier circuit comprising:

a current mirror amplifier having input and output and common terminals, said current mirror amplifier having an output circuit between its output and common terminals for connection to subsequent circuitry and exhibiting constant current gains between both its input and output terminals and its input and common terminals, and a field effect transistor of complementary conductivity type to said current mirror amplifier having a gate electrode for connection to preceding circuitry and having a channel with drain and source electrodes at opposite ends thereof respectively connected to the input and output terminals of said current mirror amplifier.

*19. A current amplifier comprising:*

*input, output, and common terminals;*

*first and second transistors of a first conductivity type, each having respective output and common electrodes defining the ends of its principal current conduction path and having a respective input electrode, their common electrodes being connected to said common terminal, their input electrodes having an interconnection therebetween, the output electrodes of said first and second transistors connecting respectively to a first circuit node and to a second circuit node, and their conduction characteristics being proportionally related so their output electrodes are conditioned to conduct proportionally related currents owing to the foreclaimed connections of their common and input electrodes applying substantially equal potentials between the common and input electrodes of each of them;*

*means for applying current received at said input terminal to said first circuit node;*

*means, connecting to said first circuit node and to said interconnection between the input electrodes of said first and second transistors, for completing a direct-coupled output-electrode to input-electrode feedback connection for said first transistor;*

*third and fourth transistors of a second conductivity type complementary to said first conductivity type, each having respective output and common electrodes defining the ends of its principal current conduction path and having a respective input electrode, their common electrodes being connected to said output terminal, their input electrodes having an interconnection therebetween, and their conduction characteristics being proportionally related so their output electrodes are conditioned to conduct proportionately related currents owing to the foreclaimed connections of their common and input electrodes applying substantially equal potentials between the common and input electrodes of each of them, the output electrodes of said third and fourth transistors connecting respectively to said second circuit node and to said common terminal; and*

*means, connecting to said second circuit node and to said interconnection between the input electrodes of said third and fourth transistors, for completing a direct-coupled output-electrode to input-electrode feedback connection for said third transistor, said foreclaimed connections of said first, second, third, and fourth transistors facilitating the current gain of said current amplifier being a predetermined value independent of the variations of the individual conduction characteristics of those transistors.*

*20. A current amplifier as set forth in claim 19 wherein said means for applying current received at said input terminal to said first circuit node comprises:*

*fifth and sixth transistors similar to said third and fourth transistors respectively, the common electrodes of said fifth and sixth transistors being connected to said input terminal, their input electrodes having an interconnection therebetween, and their output electrodes connecting respectively to said first circuit node and to said common terminal; and*

*means, connecting to said first circuit node and to said interconnection between the input electrodes of said fifth and sixth transistors, for completing a direct-coupled output-electrode to input-electrode feedback connection for said fifth transistor.*

*21. A current amplifier as set forth in claim 19 wherein said first, second, third, and fourth transistors are disposed on an integrated circuit substrate.*

*22. A current amplifier as set forth in claim 21 wherein said means for applying current received at said input terminal to said first circuit node comprises:*

*fifth and sixth transistors similar to said third and fourth transistors respectively, the common electrodes of said fifth and sixth transistors being connected to said input terminal, their input electrodes having an interconnection therebetween, and their output electrodes connecting respectively to said first circuit node and to said common terminal; and*

*means, connecting to said first circuit node and to said interconnection between the input electrodes of said fifth and sixth transistors, for completing a direct-coupled output-electrode to input-electrode feedback connection for said fifth transistor.*

*23. A current amplifier as set forth in claim 21 wherein said first and second transistors are field effect transistors; and wherein said third and fourth transistors are bipolar transistors.*

*24. A current amplifier as set forth in claim 23 wherein said means for applying current received at said input terminal to said first circuit node comprises:*

*fifth and sixth transistors similar to said third and fourth transistors respectively, the common electrodes of said fifth and sixth transistors being connected to said input terminal, their input electrodes having an interconnection therebetween, and their output electrodes connecting respectively to said first circuit node and to said common terminal; and*

*means, connecting to said first circuit node and to said interconnection between the input electrodes of said fifth and sixth transistors, for completing a direct-coupled output-electrode to input-electrode feedback connection for said fifth transistor.*

*25. A current mirror amplifier comprising:*

*input, output, and common terminals;*

*first and second transistors of a first conductivity type and third and fourth transistors of a second conductivity type complementary to said first conductivity type disposed on an integrated circuit substrate, said first and second transistors having conduction characteristics proportionally related to each other, having respective output electrodes respectively connected to a first circuit node and to a second circuit node, having respective input electrodes with an interconnection therebetween, and having respective common electrodes connected to said common terminal, whereby the common-electrode to input-electrode potentials of said first and second transistors are essentially the same as each other;*

*said third and fourth transistors having conduction characteristics proportionally related to each other, having at least one output electrode between them each of which output electrodes connects to said common terminal, having respective common electrodes respectively connected to said input terminal and to said output terminal, and having respective input electrodes to which potentials at said first circuit node and at said second circuit node are respectively applied;*

*means, connected at said first circuit node and at said interconnection between the input electrodes of said first and second transistors, for completing a direct-*

*coupled output-electrode to input-electrode feedback connection of said first transistor; and*

*first and second conductive means, exhibiting proportionally related conduction characteristics, the first conductive means connected between said first circuit node and said input terminal, and the second conductive means connected between said second circuit node and said output terminal.*

*26. A current mirror amplifier as set forth in claim 25, wherein said first and second conductive means comprise fifth and sixth transistors of said second conductivity type also disposed on said integrated circuit substrate, having respective input electrodes to which the potentials at said first and second circuit nodes are respectively applied, having respective output electrodes connected to said first circuit node and to said second circuit node, and having respective common electrodes respectively connected to said input terminal and to said output terminal.*

*27. A current mirror amplifier as set forth in claim 26 wherein said first and second transistors are of field-effect transistor type and said third, fourth, fifth and sixth transistors are of bipolar transistor type.*

*28. A current mirror amplifier as set forth in claim 25 wherein said first and second transistors are of field-effect transistor type and said third and fourth transistors are of bipolar transistor type.*

*29. A composite current mirror amplifier comprising:*

*input, output, and common terminals; and*

*first and second component current mirror amplifiers of complementary conductivity types, said first component current mirror amplifier having an input connection to which said input terminal is connected, having a common connection to said common terminal and having an output connection—and said second component current mirror amplifier having an input connection to which the output connection of said first component current mirror amplifier is connected, having an output connection to said common terminal and having a common connection to said output terminal.*

*30. A composite current mirror amplifier comprising:*

*input, output, and common terminals; and*

*first, second, and third component current mirror amplifiers, the latter two of a conductivity type complementary to that of the first, said first component current mirror amplifier having input and output connections and having a common connection to said common terminal, said second component current mirror amplifier having an input connection to the input connection of said first component current mirror amplifier, having an output connection to said common terminal, and having a common connection to said input terminal, and said third component current mirror amplifier having an input connection to which the output connection of said first component current mirror amplifier is connected, having an output connection to said common terminal, and having a common connection to said output terminal.*

* * * * *